United States Patent
Natsume

(10) Patent No.: US 8,444,125 B2
(45) Date of Patent: May 21, 2013

(54) ATTACHING APPARATUS FOR LOAD PORT APPARATUS

(75) Inventor: Mitsuo Natsume, Toyohashi (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 661 days.

(21) Appl. No.: 12/689,648

(22) Filed: Jan. 19, 2010

(65) Prior Publication Data

US 2010/0143027 A1    Jun. 10, 2010

Related U.S. Application Data

(63) Continuation of application No. PCT/JP2008/063051, filed on Jul. 18, 2008.

(30) Foreign Application Priority Data

Jul. 19, 2007    (JP) .................................. 2007-187848

(51) Int. Cl.
  *B23Q 3/00*    (2006.01)
  *B21D 39/03*    (2006.01)
  *B65B 1/04*    (2006.01)
  *F16B 9/00*    (2006.01)

(52) U.S. Cl.
  USPC ............... 269/17; 269/309; 29/428; 403/263; 141/98; 248/544; 248/222.13

(58) Field of Classification Search
  USPC ...................... 269/17, 903; 254/6 B, 3 B, 9 B, 254/2 B; 29/428; 403/263; 141/98
  See application file for complete search history.

(56) References Cited

U.S. PATENT DOCUMENTS

| | | | |
|---|---|---|---|
| 6,138,721 A * | 10/2000 | Bonora et al. ................. | 141/98 |
| 6,607,341 B1 * | 8/2003 | Wade ................................ | 414/10 |
| 6,883,770 B1 * | 4/2005 | Miyajima et al. ............. | 248/544 |
| 7,906,978 B2 * | 3/2011 | Ehrenberg ............... | 324/750.19 |
| 2002/0041066 A1 | 4/2002 | Lin et al. | |
| 2004/0258505 A1 * | 12/2004 | Wu ........................... | 414/217.1 |

FOREIGN PATENT DOCUMENTS

| | | |
|---|---|---|
| DE | 198 82 665 | 11/2000 |
| JP | 2000-332079 | 11/2000 |
| JP | 2001-345366 | 12/2001 |
| JP | 2001-526458 | 12/2001 |
| JP | 2002-134582 | 5/2002 |
| KR | 2001-0066797 | 7/2001 |
| WO | WO 99/12191 | 3/1999 |

* cited by examiner

*Primary Examiner* — Monica S. Carter
*Assistant Examiner* — Seahee Yoon
(74) *Attorney, Agent, or Firm* — Oblon, Spivak, McClelland, Maier & Neustadt, L.L.P.

(57) ABSTRACT

An attaching apparatus for attaching a load port apparatus to an attaching face of a semiconductor manufacturing apparatus includes a bogie truck body to be attached to a lower end portion of the load port apparatus. A pair of downwardly projecting positioning protrusions having a circular transverse sectional shape are also attached to the lower end portion of the load port apparatus. A support plate is secured to a lower end portion of the attaching face in such a manner as to project toward the load port apparatus. A pair of positioning recesses are formed on an upper face of the support plate and each has a circular hollow shape, in a plan view, such that said plurality of positioning protrusions may be individually fitted therein.

12 Claims, 10 Drawing Sheets

(A)

(B)

(C)

(D)

(A)

(B)

(A)

(B)

ATTACHING APPARATUS FOR LOAD PORT APPARATUS

CROSS REFERENCE TO RELATED APPLICATIONS

This application is the National Stage of PCT Application Number PCT/JP2008/063051, filed Jul. 18, 2008, and claims priority to JP 2007-187848, filed Jul. 19, 2007, the entire contents of both of which are incorporated herein by reference.

TECHNICAL FIELD

This invention relates to a load port apparatus which is removably mounted on an attaching face of a wall body of a semiconductor fabrication apparatus for transferring a wafer between the inside and the outside of the manufacturing apparatus and which includes an attaching apparatus which can carry out, upon mounting on the attaching face, the attachment and positioning of the load port apparatus substantially at the same time.

BACKGROUND ART

In a semiconductor factory, wafers as products are accommodated for each plural number into a wafer carrier (hereinafter referred to simply as "carrier") and carried in this state to individual equipments in a manufacture line in a unit of a carrier by a carrier carrying system. As a carrier, an FOUP (Front Opening Unified Pod) is frequently used. A load port apparatus is mounted on an attaching face of a wall body of a semiconductor manufacturing apparatus (which may sometimes be hereinafter referred to merely as "manufacturing apparatus") for receiving wafers in a unit of a carrier and carrying out processing for the wafers. The load port apparatus receives a carrier carried thereto from the carrier carrying system to the manufacturing apparatus and transfers the wafers accommodated in the carrier into the manufacturing apparatus. Further, the load port apparatus receives the wafers processed in the manufacturing apparatus and accommodates the wafers back into the carrier.

The load port apparatus is removable from the manufacturing apparatus. For example, for the object of cleaning of the inside of the manufacturing apparatus or of exchange or maintenance of various components in the manufacturing apparatus, the load port apparatus is frequently mounted on or removed from the manufacturing apparatus. Further, when the removed load port apparatus or another load port apparatus scheduled to be attached is to be moved, for example, a bogie truck is mounted at a lower portion of the load port apparatus to move the load port apparatus to a predetermined place. In order to carry out exchange or maintenance of various components in the manufacturing apparatus rapidly without stopping the carrier carrying system, it is necessary for removal and mounting of the load port apparatus to be carried out rapidly. Therefore, reduction of the removing and mounting time of the load port apparatus, particularly reduction of the mounting (attaching) time, is demanded strongly. Although normally 10 to 20 minutes are required for the mounting, attaching time of two to five minutes is demanded recently, and short attaching time is one of significant characteristics of the load port apparatus.

One of load port apparatus designed for reduction of the attaching time is, for example, such a load port apparatus L' having an attaching apparatus A' as disclosed in Patent Document 2. As shown in FIGS. 10(A) and 10(B), the attaching apparatus A' of a lower side plate portion of the load port apparatus L' is formed from a positioning plate 82 formed at a lower end portion of a mounting board 81 of the load port apparatus L', a pair of positioning guides 83a and 83b secured to a lower portion of an attaching face 80 of a manufacturing apparatus E', and a plate holder 84 sandwiched between the positioning guides 83a and 83b for receiving the positioning plate 82. When the load port apparatus L' is mounted on the attaching face 80, the positioning plate 82 is positioned by being inserted between the positioning guides 83a and 83b and supported by the plate holder 84. Further, the mounting board 81 contacts at a lower end face thereof with a lower bracket 85 to support the entire load port apparatus L'. In the case of the attaching apparatus A', since the positioning plate 82 is in the form of a thin plate and also the space into which the positioning plate 82 is inserted is narrow, it is not easy to adjust and insert the positioning plate 82 between the positioning guides 83a and 83b and much time is required. Further, from the configuration that the positioning plate 82 is inserted, the width of the positioning plate 82 is smaller than the distance between the positioning guides 83a and 83b, and therefore, even if the positioning plate 82 is inserted, a small gap appears and complete positioning cannot be achieved. Further, even if positioning of the load port apparatus L' can be carried out, since the entire load port apparatus L' is supported by the lower bracket 85 in the form of a thin plate, the stability is low and, when the load port apparatus L' is to be fastened to the attaching face 80 by means of screws, it must be held up carefully so that a lower end face of the mounting board 81 of the load port apparatus L' may not be displaced from the lower bracket 85. It is to be noted that reference numeral 86 in the figure denotes a caster of the load port apparatus L'.

Patent Document 1: Japanese Patent Laid-Open No. 2000-332079
Patent Document 2: Japanese Patent Laid-Open No. 2001-345366

DISCLOSURE OF INVENTION

Technical Problem

It is a subject of the present invention to reduce the attaching time significantly by attaching a load port apparatus to an attaching face of a manufacturing apparatus simply and with a moderated operation procedure.

Technical Solution

In order to solve the subject described above, according to one mode of embodying the invention of the present application, there is provided an attaching apparatus for attaching a load port apparatus, which is configured to receive a wafer carrier in which a wafer is accommodated in order to transfer the wafer to and from a semiconductor manufacturing apparatus, to an attaching face of the semiconductor manufacturing apparatus, including a bogie track body attached to a lower end portion of the load pot apparatus, a pair of positioning protrusions attached to the lower end portion of the load port apparatus in such a manner as to project downwardly, a support plate secured to a lower end portion of the attaching face in such a manner as to project to this side, and a pair of positioning recesses formed on an upper face of the support plate in such a manner as to be fitted with the positioning projections.

With the configuration described above, if the load port apparatus is moved, in a state wherein the portion of the bogie truck body at the positioning protrusions on the interior side of the bogie truck body is lifted, so as to approach the attaching face of the manufacturing apparatus and then, immediately before the load port apparatus comes into contact with the attaching face, the lower end portion on the interior side of the bogie truck body in the lifted state is moved down, then the pair of left and right positioning protrusions provided in a projecting manner in the downward direction on the interior side of the bogie truck body are fitted into the pair of left and right positioning recesses formed on the upper face of the support plate attached to the attaching face, respectively. Consequently, the bogie truck body floats a little from the installation face, and the entire load port apparatus is supported on the support plate in a state wherein the rear face of the load port apparatus, that is, the rear face side of the mounting board, closely contacts with the attaching face. Further, since the load port apparatus is supported on the support plate, when the load port apparatus is to be fastened to the attaching face by means of screws, there is no necessity to fasten the entire peripheral edge of the load port apparatus by means of bolts and so forth, but only it is necessary to fasten the upper end portion. Consequently, the time required for fastening by means of screws can be reduced.

Each of the positioning protrusions may have a circular transverse sectional shape, and each of the positioning recesses may have a circular hollow shape as viewed in plan such that the positioning protrusions are individually fitted with the positioning recesses.

With the configuration described above, of the pair of positioning protrusions and the pair of positioning recesses which are fitted with each other, the positioning protrusions have a circular transverse section and the positioning recesses have a circular shape as viewed in plan. Therefore, where the protrusions and the recesses are fitted with each other, the fitting portions are disabled from moving in all directions in a horizontal plane. In other words, with the load port apparatus, positioning is carried out in all directions in the horizontal plane with respect to the attaching face. As a result, by such simple operation that the load port apparatus is moved so as to approach the attaching face in the state wherein the interior side of the bogie truck body is lifted and then the interior side of the bogie truck body is moved down at the end of the movement to cause the pair of left and right positioning protrusions, which are provided in a downward direction on the interior side of the bogie truck body, to be fitted into the pair of positioning recesses, which are formed on the support plate secured to the lower end portion of the attaching face, not only positioning of the load port apparatus with respect to the attaching face in a vertical direction is carried out but also positioning of the load port apparatus with respect to the attaching face in the depthwise direction (horizontal direction perpendicular to the attaching face) and the widthwise direction (horizontal direction parallel to the attaching face) is carried out at the same time.

Each of the positioning protrusions may include a supporting body and a supporting sphere, and the spherical body may be supported for rotation in all directions in a horizontal plane on the support body in a state wherein part of the supporting sphere projects from a bottom face of the support body.

With the configuration described above, when the pair of positioning protrusions are fitted into the pair of positioning recesses, even if the load port apparatus is disposed at a position displaced a little with respect to the positioning recesses, the supporting spheres roll and are fitted into the positioning recesses and the load port apparatus moves a little to its normal position and is positioned there. Therefore, the positioning operation is facilitated.

The support plate may be formed integrally with a fixing plate which is secured to the attaching face through bolts secured to threaded holes formed in a standard pitch on the attaching face.

With the configuration described above, when the support plate is to be secured to the lower end portion of the attaching face, the attaching holes formed in the standard pitch in a standardized state on the attaching face in advance are utilized without forming threaded holes for exclusive use for attaching the support plate in the attaching face. Consequently, the support plate can be secured to the lower end portion of the attaching face without depending upon the manufacturing apparatus. Further, since there is no necessity to perforate new attaching holes, reduction in attaching time can be anticipated.

A pair of left and right casters may be attached to this side of the bogie truck body, and a pair of left and right support bolts whose height is adjustable may be attached to the interior side of the bogie truck body.

With the configuration described above, since the pair of left and right support bolts whose height is adjustable are attached to the interior side of the bogie truck body, the load port apparatus to which the bogie truck body is attached can support itself stably. Further, since the load port apparatus can be set to a posture tilted forwardly a little to this side by adjusting the height of the support bots, lifting of the interior side of the load port apparatus can be carried out readily.

The load port apparatus to which the bogie truck body is attached may be capable of supporting itself. The bogie truck body and the positioning protrusions may be removably mounted on the load port apparatus, and the support plate may be removably mounted on the attaching face.

According to another mode of embodying the invention of the present application, there is provided an attaching method for attaching a load port apparatus, which is configured to receive a wafer carrier in which a wafer is accommodated in order to transfer the wafer to and from a semiconductor manufacturing apparatus, to an attaching face of the semiconductor manufacturing apparatus, including a step of disposing the load port apparatus in front of the attaching face, a step of tilting the load port apparatus with respect to the attaching face, a step of moving the load port apparatus toward the attaching face of the semiconductor manufacturing apparatus in a state wherein the load port apparatus is tilted, a step of fitting a pair of positioning protrusions attached to a lower end portion of the load port apparatus so as to extend downwardly into a pair of positioning recesses formed on an upper face of a support plate secured to a lower end portion of the attaching face so as to project to this side, and a step of securing an upper end portion of the load port apparatus to the attaching face.

Advantageous Effect

According to the present invention, when the load port apparatus is to be attached to the attaching face of the manufacturing apparatus, by causing the positioning protrusions secured to the lower end portion of the load port apparatus to be fitted into the positioning recesses formed on the support plate secured to the lower end portion of the attaching face, since the load port apparatus is positioned in all directions of the vertical direction and the widthwise direction and the entire load port apparatus is supported on the support plate at the same time, fastening of the load port apparatus to the attaching face by means of screws is required only for the upper end portion. Accordingly, operation for positioning and fastening by means of screws is simplified, and the time required for the operation decreases. As a result, the time required for attachment of the load port apparatus is reduced significantly.

EXPLANATION OF REFERENCE SYMBOLS

Figure 1:
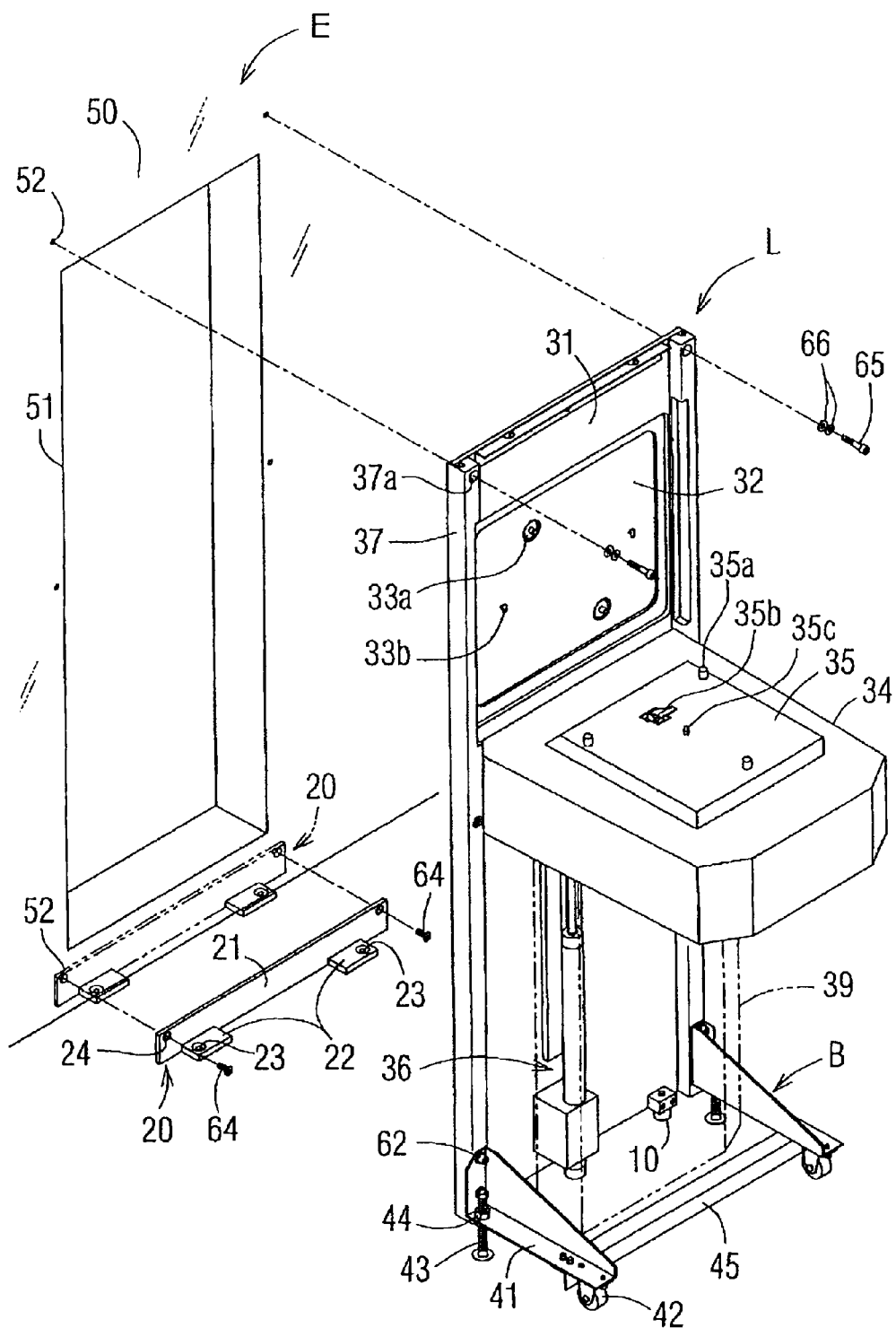
FIG. 1 is a general perspective view of a load port apparatus L according to the present invention.

A1, A2, A3: Attaching apparatus
B: Bogie truck body
C: Semiconductor manufacturing apparatus (manufacturing apparatus)
L: Load port apparatus
10, 10', 10": Positioning protrusion
11: Supporting sphere
20, 20', and 20": Positioning support body
21: Fixing plate
22: Support plate
23, 23', 23": Positioning recess
23a, 23a': Protrusion receiving portion
23b, 23b': Opening
23c, 23c': Protrusion locking portion
31: Mounting board
41: Frame
42: Caster
43: Support bolt
50: Wall body
51: Attaching face

BEST MODE FOR CARRYING OUT THE INVENTION

Figure 2:
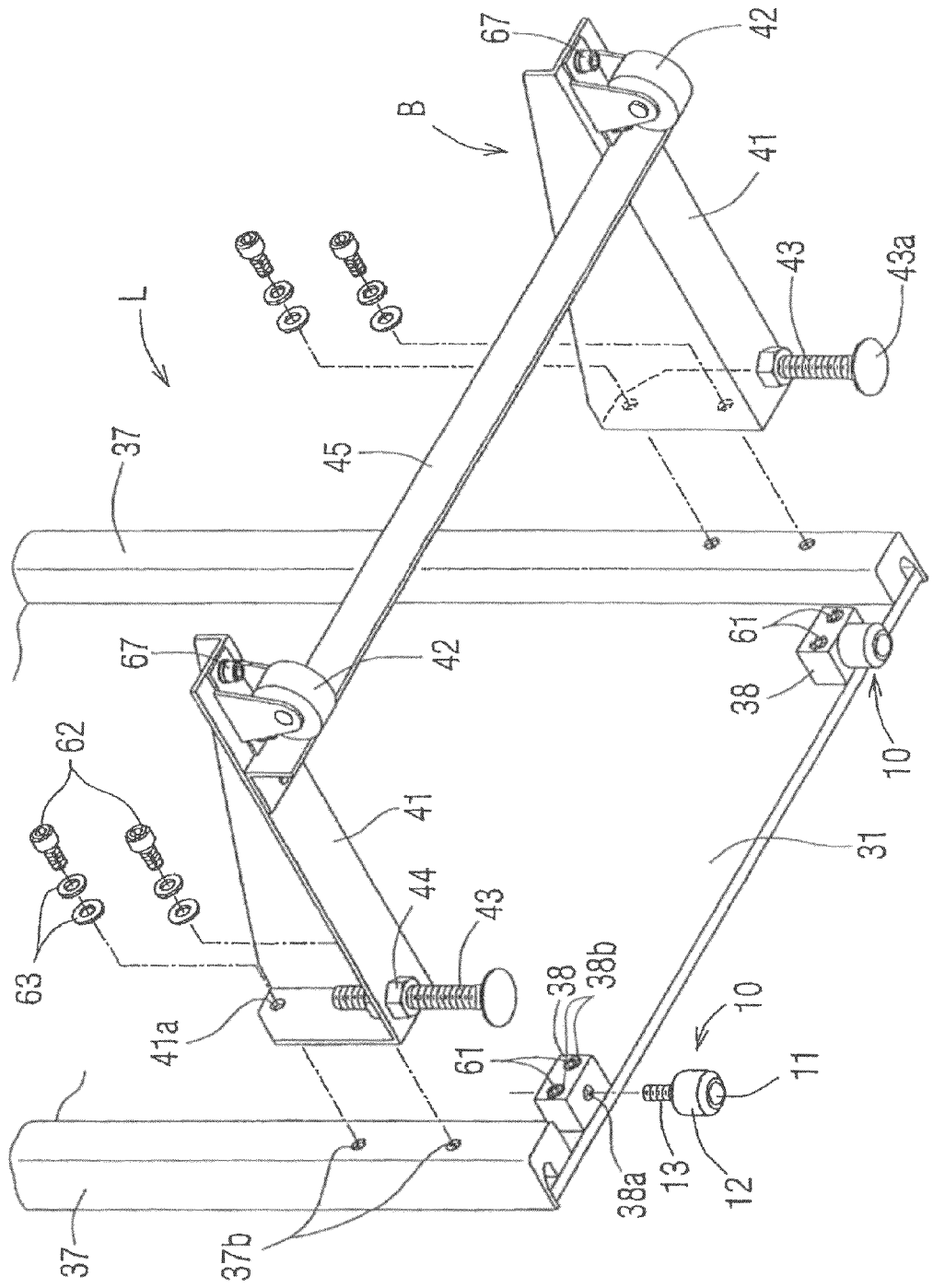
FIG. 2 is an enlarged perspective view showing a positioning protrusion 10 of an attaching apparatus A1 and a lower side portion of the load port apparatus L attached to a bogie truck body B as viewed from below.
Figure 3:
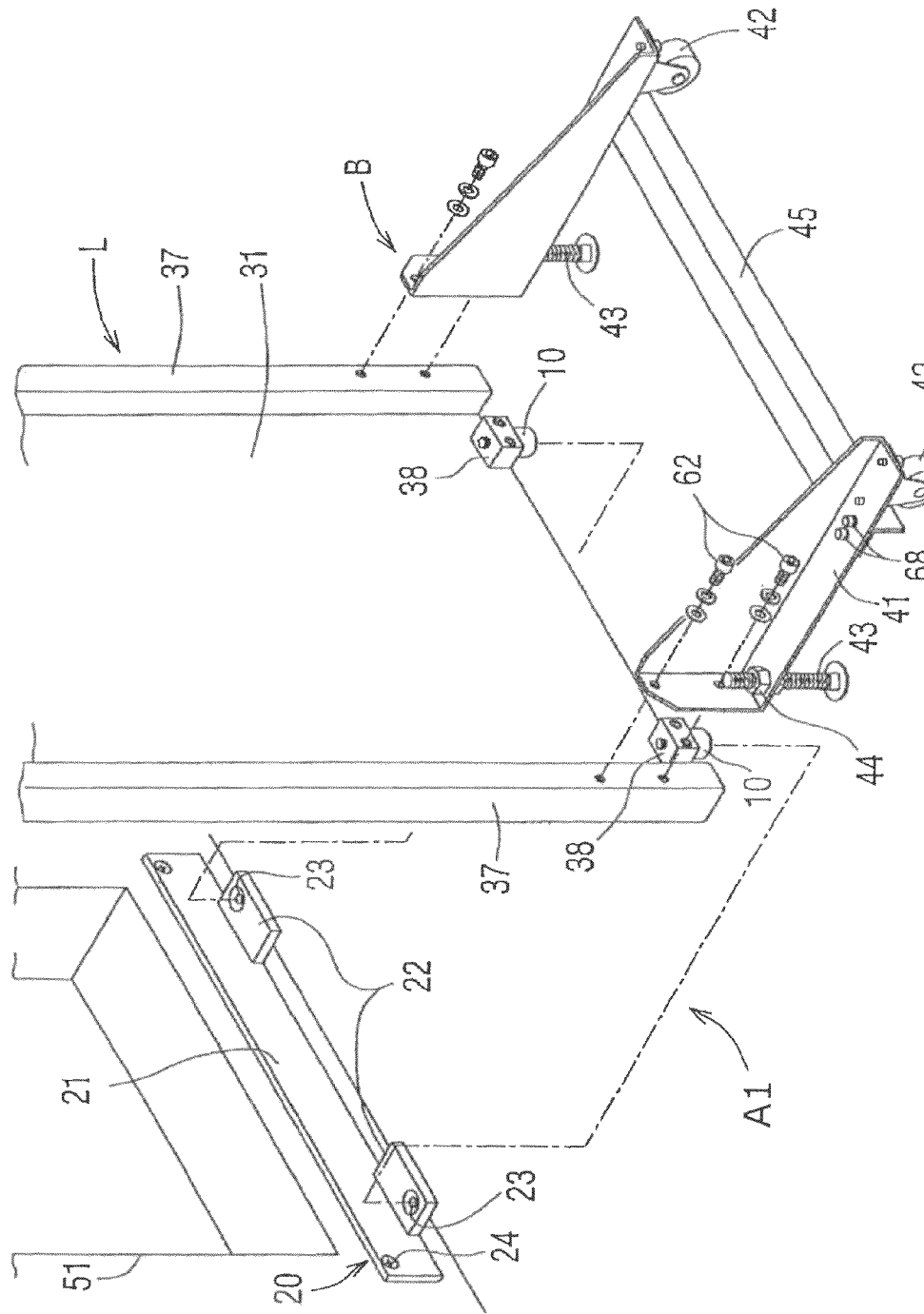
FIG. 3 is a view showing the positioning protrusion 10 and a positioning support body 20 of the attaching apparatus A1.
Figure 4:
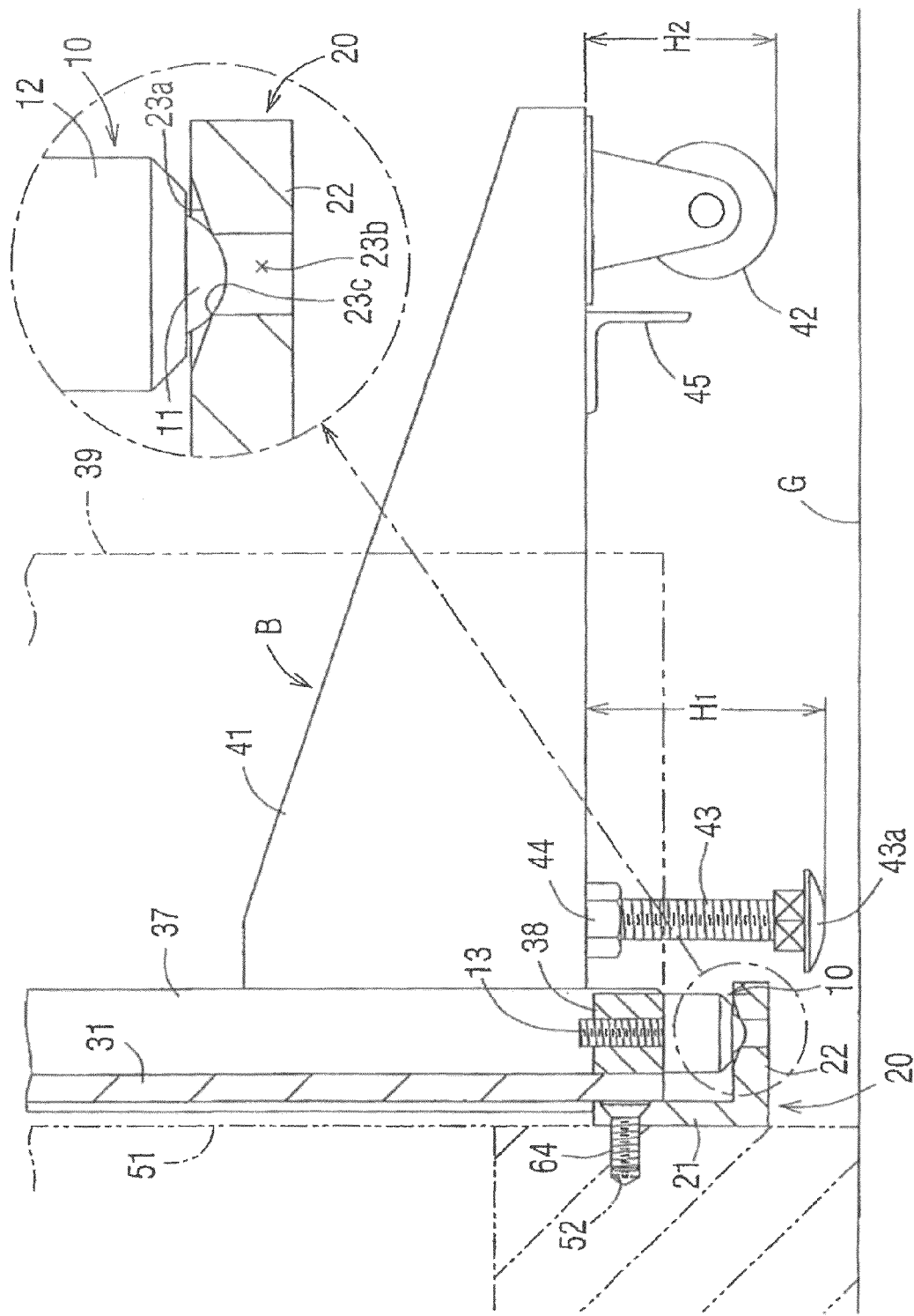
FIG. 4 is a vertical sectional view of a lower side portion of the load port apparatus L in a state wherein the load port apparatus L is attached to an attaching face 51.
Figure 5:
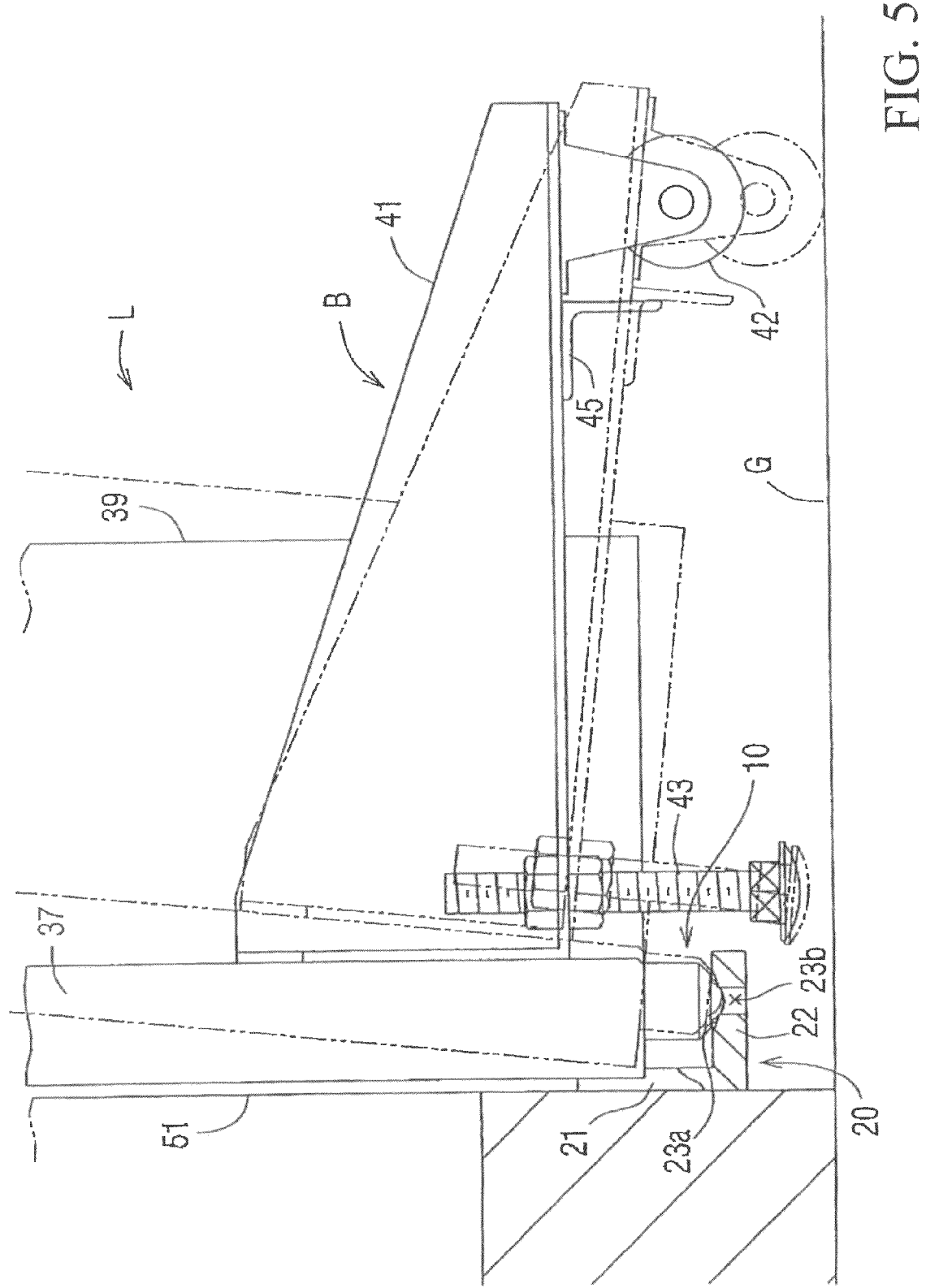
FIG. 5 is a view showing the positioning protrusion 10 before and after fitted in a positioning recess 23 in the vertical sectional view of the attaching apparatus A1.
Figure 6:
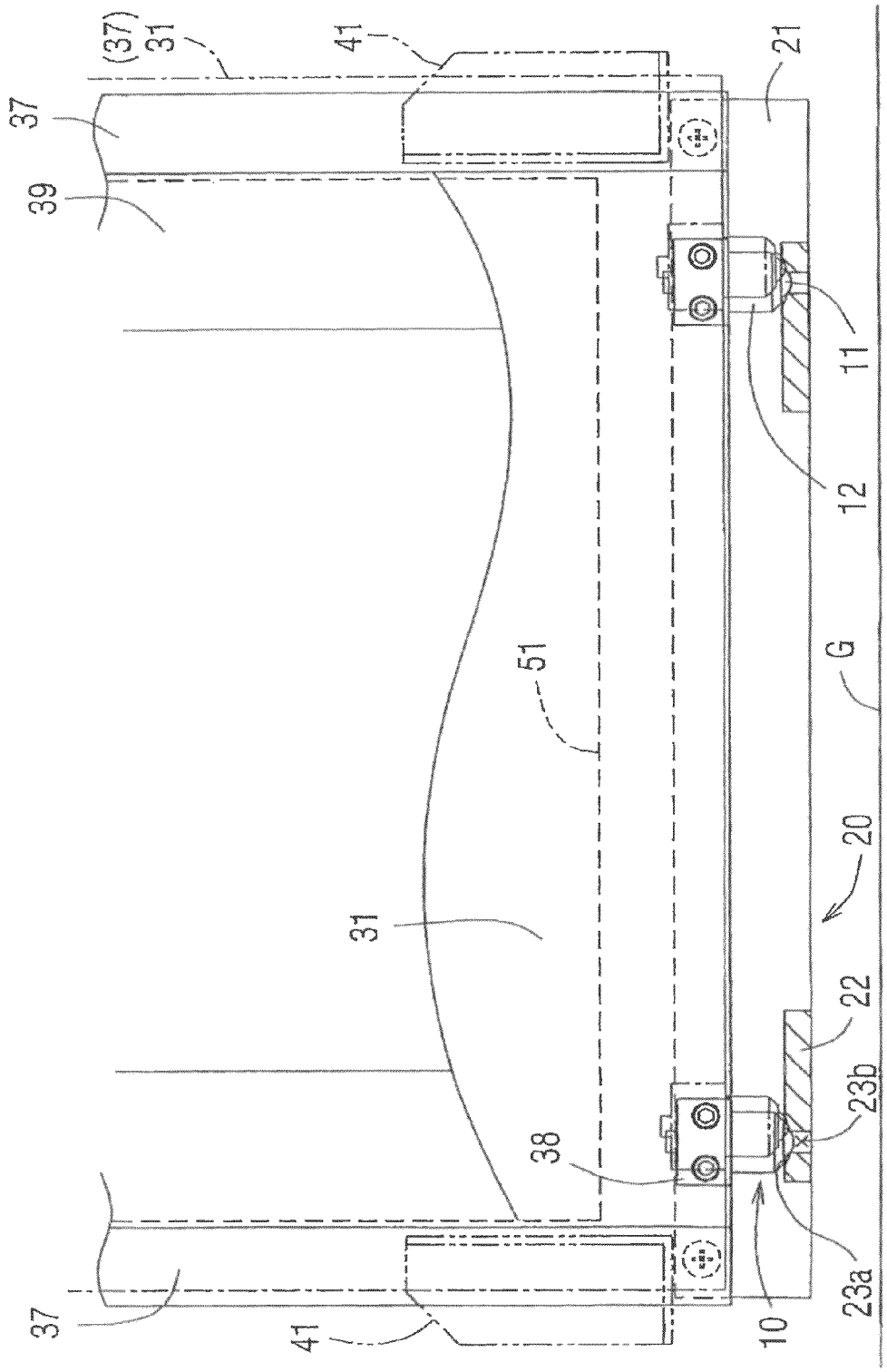
FIG. 6 is a front elevational view showing a lower side portion of the load port apparatus L before and after the positioning protrusion 10 is fitted in the positioning recess 23.
Figure 7:
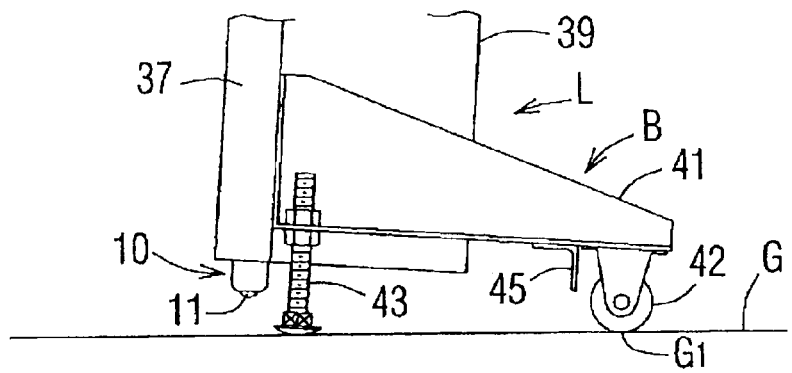
FIGS. 7(A) and 7(B) are views illustrating a procedure of attaching the load port apparatus L to the attaching face 51.
Figure 7:
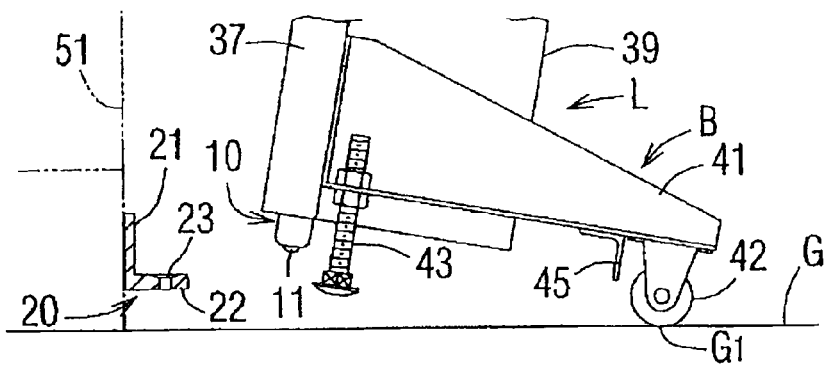
Figure 7:
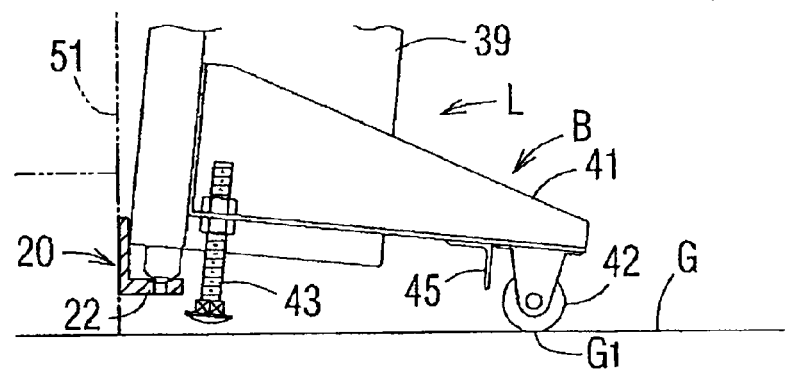
Figure 7:
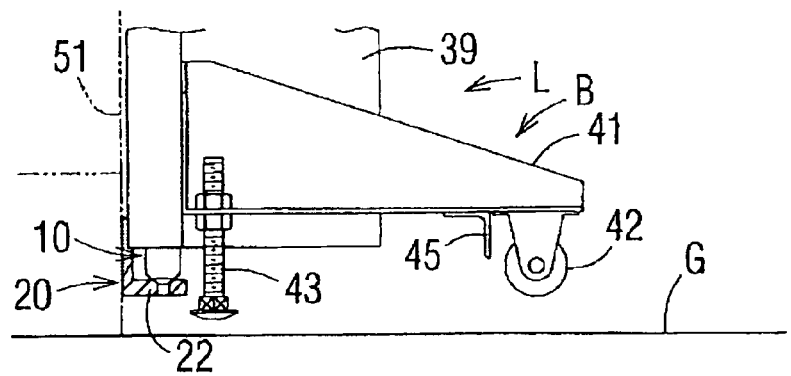

In the following, the present invention is described in more detail in connection with the best mode thereof. FIG. 1 is a general perspective view of a load port apparatus L according to the present invention. FIG. 2 is an enlarged perspective view showing a positioning protrusion 10 of an attaching apparatus A1 and a lower side portion of the load port apparatus L attached to a bogie truck body B as viewed from below. FIG. 3 is a view showing the positioning protrusion 10 and a positioning support body 20 of the attaching apparatus A1 of the load port apparatus L. FIG. 4 is a vertical sectional view of a lower side portion of the load port apparatus L in a state wherein the load port apparatus L is attached to an attaching face 51. FIG. 5 is a view showing the positioning protrusion 10 before and after fitted in a positioning recess 23 in the vertical sectional view of the attaching apparatus A1. FIG. 6 is a front elevational view showing a lower side portion of the load port apparatus L before and after the positioning protrusion 10 is fitted in the positioning recess 23. FIGS. 7(A) and 7(B) are views illustrating a procedure of attaching the load port apparatus L to the attaching face 51.

First, a load port apparatus L is described with reference to FIG. 1. The load port apparatus L is formed from a mounting board 31 in the form of a rectangular plate mounted on an attaching face 51 of a wall body 50 of a manufacturing apparatus E, a wafer transfer window 32 formed on the mounting board 31, a carrier table 34 provided horizontally in a projecting manner at a substantially lower end portion of the wafer transfer window 32 and directed to this side, and a carrier base 35 disposed for back and forth movement along a carrying in and out direction of a wafer on the carrier table 34 in order to receive a carrier (not shown) placed thereon. The wafer transfer window 32 includes a pair of suction mechanisms 33a and 33b for sucking a lid member of a carrier K to open and close the lid member. Positioning supporting pins 35a for receiving the carrier K in a positioned state, a clamp device 35b for locking the carrier K placed on the carrier base 35, and a seated state sensor 35c for detecting that the carrier K is placed on the carrier base 35. Here, the side of the load port apparatus L on which the carrier table 34 is disposed is defined as the front face side of the load port apparatus L. On the front face side, a lifting apparatus 36 of the lid member opening and closing apparatus for removably opening and closing the lid member of the carrier K is disposed on the lower side of the carrier table 34 and is normally covered with a cover body 39. A pair of side plate portions 37 are attached along a vertical direction to the opposite left and right side end portions of the mounting board 31. A bogie truck body B hereinafter described is mounted in the proximity of lower end portions of the mounting board 31. Further, a pair of attaching devices 38 are mounted on the inner side of the side plate portions 37 at a lower end portion of the mounting board 31, and a pair of positioning protrusions 10 which compose the attaching apparatus A1 of the load port apparatus L are provided in a projecting manner in a downward direction through the attaching devices 38. It is to be noted that, although a lifting apparatus for a mapping apparatus which detects presence or absence of a wafer at each stage in the carrier K is disposed at a lower portion sidewardly of the carrier table 34, it is not shown in the figure. On the other hand, in order to attach the load port apparatus L, an opening of a rectangular shape corresponding to the size in a longitudinal (vertical) direction and a widthwise direction of the load port apparatus L is formed in the wall body 50 of the manufacturing apparatus E, and a face of the wall body 50 on the side contacting with (opposing to) the rear face of the mounting board 31 in the opening is determined as an attaching face 51. Attaching holes 52 for securely attaching the load port apparatus L by means of bolts or the like are formed in a standard pitch at specified predetermined locations in the proximity of a peripheral edge portion of the attaching face 51. Generally, the attaching holes 52 are formed at totaling six places including places in the proximity of the four corners of the attaching face 51 and two left and right places in the proximity of the center in the vertical direction. The positioning support body 20 which composes the attaching apparatus A1 is attached at a lower end portion of the attaching face 51 by means of screws.

Now, the attaching apparatus A1 of the load port apparatus L is described with reference to FIGS. 1 to 3. The attaching apparatus A1 is composed of the pair of positioning protrusions 10 and the positioning support body 20. First, a configuration of the positioning protrusions 10 is described. As shown in FIG. 2, each positioning protrusion 10 is composed of a supporting sphere 11 and a supporting body 12 for supporting the supporting sphere 11. The supporting sphere 11 is supported on the supporting body 12 in a state wherein it is accommodated in the supporting body 12 such that it partially protrudes from the bottom face of the supporting body 12 and contacts at a tip of the protruding portion thereof with a positioning recess 23. In the present embodiment, a known ball bearing is adopted as an example of the positioning protrusions 10. The ball bearing is for facilitating carrying by allowing the supporting sphere 11, which receives a load of an article to be carried, to smoothly roll on an installation face G or a lower face of the article to be carried. It is to be noted that the shape of the positioning protrusion 10 must only be a projecting body which can fit with the positioning recess 23 and may have a cross sectional shape other than a circular shape. Although the method of attaching the positioning protrusions 10 to a lower end portion of the load port apparatus L does not matter, in the present embodiment, the positioning protrusions 10 are attached through an attaching device 38. In particular, as shown in FIG. 2, a threaded portion 13 is secured uprightly at an upper end of each positioning protrusion 10, and the threaded portion 13 is screwed from below into a threaded hole 38a extending through a central portion in the left and right direction of the attaching device 38 in the vertical direction to attach the positioning protrusion 10 to the attaching device 38. It is to be noted that, as a method of attaching the attaching device 38 to a lower end portion of the mounting board 31 of the load port apparatus L, in the present embodiment, the attaching device 38 is removably mounted by screwing screws 61 into a pair of threaded holes 38b formed in the attaching device 38 and extending through the attaching device 38 in the forward and backward direction (direction perpendicular to the widthwise direction in a horizontal plane) in such a manner as to sandwich the threaded hole 38a from the opposite sides so that the threaded holes 38b may not interfere with the threaded hole 38a and threaded holes (not shown) formed in the mounting board 31.

Now, the positioning support body 20 of the attaching apparatus A1 is described with reference to FIGS. 1, 3 and 4. The positioning support body 20 is configured from a fixing plate 21 in the form of an elongated plate secured to a lower end portion of the attaching face 51, and a pair of support plates 22 attached in the proximity of a lower end portion of the fixing plate 21 and projecting perpendicularly to the attaching face 51. A pair of threaded holes 24 are formed at the opposite end portions in the longitudinal direction (widthwise direction) of the fixing plate 21. The attaching holes 52 are formed in a specified standard pitch on a periphery edge of the attaching face 51, and the width provided by the two left and right threaded holes 24 corresponds to the width between the attaching holes 52 on the opposite left and right sides across the attaching face 51. Therefore, the positioning support body 20 is attached to a lower end portion of the attaching face 51 by tightening screws 64 such as bolts into the threaded holes 24 of the fixing plate 21 and the attaching holes 52 described above. Since the positioning support body 20 has such a configuration as described above, when the positioning support body 20 is to be attached to the attaching face 51, the attaching holes 52 may be utilized but there is no necessity to newly perforate holes in the wall body 50. Further, since the attaching holes 52 can be utilized, the positioning support body 20 can be used also for another manufacturing apparatus E and has flexibility. Now, the support plate 22 is described. Although the support plate 22 may be a single elongated plate similarly to the fixing plate 21, in the present embodiment, a pair of support plates 22 each in the form of a short piece are attached in a left and right pair to the fixing plate 21. A pair of positioning recesses 23 for fitting with the pair of positioning protrusions 10 are formed on the support plates 22, and in the present embodiment, the positioning recesses 23 are provided one by one on the left and right support plates 22. Accordingly, the width provided by the positioning recesses 23 and the width provided by the pair of positioning protrusions 10 correspond in magnitude to each other.

Now, the positioning recesses 23 of the attaching apparatus A1 are described with reference to FIG. 4. Each positioning recess 23 has a circular hollow shape as viewed in plan. In the present embodiment, the positioning recess 23 includes a protrusion receiving portion 23a having a hollow circular truncated conical shape formed like a bowl from its outer peripheral rim to its inner peripheral edge, and whose diameter decreases along the depthwise direction from an upper face of the support plate 22, and an opening 23b opened cylindrically with a diameter equal to that of the bottom portion of the protrusion receiving portion 23a and extending from the bottom portion to the rear face of the support plate 22. The magnitude of the diameter of the bottom portion of the protrusion receiving portion 23a is smaller than a maximum diameter of the projecting portion of the supporting sphere 11 of the positioning protrusion 10. In a state wherein the positioning protrusion 10 is fitted in the positioning recess 23, the supporting sphere 11 is locked by a peripheral edge portion (protrusion locking portion 23c) of the bottom portion with the tip of the protruding portion thereof fitted a little in the opening 23b and receives the overall load of the load port apparatus L. It is to be noted that the shape of the positioning recess 23 as viewed in plan is not limited to a circular shape but may be any shape only if the positioning recess 23 can fit with the shape of the positioning protrusion 10.

Now, the bogie truck body B is described with reference to FIGS. 1 to 4. The bogie truck body B is provided to freely move the load port apparatus L, and includes a pair of left and right frames 41 attached to lower end portions of the side plate portions 37 individually by screws 62 such as bolts and disposed on this side in the longitudinal direction (vertical direction) of the side plate portions 37, a pair of casters 42 mounted below end portions on this side of the frames 41, a pair of left and right support bolts 43 attached to an end portion on the interior side of the frames 41 such that the height thereof can be adjusted in order to allow self-supporting of the load port apparatus L, and a connecting frame 45 for connecting the frames 41 in the proximity of end portions on this side to each other such that the pair of frames 41 extend in an opposing relationship and in parallel to each other. In the present embodiment, as shown in FIG. 2, each frame 41 is formed from a plate-like member having a substantially right-angled triangular shape, and in a flange portion erected uprightly from the two sides of the right-angled triangle by which the right angle is defined, threaded holes 41a for securing the frame 41 to the side plate portion 37, threaded holes for fitting the support bolts 43 and threaded holes (not shown) for mounting the casters 42 are perforated. The screws 62 such as bolts are screwed through washers 63 in the threaded holes 41a and threaded holes 37b formed in the proximity of a lower end portion of the side plate portion 37 to secure each of the frames 41 to each side plate portion 37. Therefore, the bogie truck body B is removably mounted on the load port apparatus L. The casters 42 may be of the type used popularly and are mounted on the frames 41 by means of screws 67 such as bolts. Each support bolt 43 is fitted in a vertical direction into a threaded hole formed in the frame 41 and screwed into a nut 44 as a stopper such that the height thereof can be adjusted. The support bolt 43 may be any other member than the bolt only if the height can be adjusted and the configuration of the support bolt 43 does not matter. The support bolt 43 contacts at a lower end portion thereof with the installation face G through a dish-shaped contacting portion 43a. Where the height H1 of the support bolt 43 (vertical distance from the lower face of the frames 41 of the support bolt 43 to the lower end portion of the contacting portion 43a) is set greater than the height H2 of the caster 42 (vertical distance from the lower face of the frame 41 to the lower end portion of the caster 42) as shown in FIG. 4, the load port apparatus L to which the bogie truck body B is attached can be self-supported in a posture tilted forwardly a little to this side. In a state wherein the positioning protrusion 10 is fitted in the positioning recess 23, the casters 42 and the support bolts 43 are in a state floating from the installation face G. Further, the connecting frame 45 is formed, for example, from an elongated member having a substantially L-shaped cross section and is disposed such that the longitudinal direction of the connecting frame 45 extends perpendicularly to the longitudinal direction of each frame 41, that is, the connecting frame 45 extends in parallel to the widthwise direction of the load port apparatus L. The connecting frame 45 is secured at individual end portions thereof to portions of each frame 41 rearwardly (on the interior side) of the casters 42 by means of screws 68 such as bolts. Therefore, the frames 41 secured to the side plate portions 37 are always opposed in parallel to each other. It is to be noted that, since the components of the bogie truck body B are individually secured by means of screws, disassembly and assembly of the bogie truck body B are possible.

The load port apparatus L in the state wherein it is attached to the attaching face 51 is generally supported on the support plates 22 with the positioning protrusions 10 thereof fitted in the positioning recesses 23 and is disposed stably on the attaching face 51 by screws 65 such as bolts which are screwed in threaded holes 37a formed at upper edge portions of the left and right side plate portions 37 of the load port apparatus L and the corresponding attaching holes 52 on the peripheral edge of the attaching face 51 with washers 66 or the like interposed therebetween.

Now, operation of the attaching apparatus A1 of the load port apparatus L is described with reference to FIGS. 4 to 6. When the load port apparatus L is to be attached to the attaching face 51 of the wall body 50 of the manufacturing apparatus E, the load port apparatus L is moved toward the wall body 50 of the manufacturing apparatus E in a state wherein the positioning protrusions 10 of the load port apparatus L on the mounting board 31 side (on the interior side of the bogie truck body B) are lifted. Then, the positioning protrusions 10 in the lifted state are moved down immediately before the load port apparatus L is brought into contact with the attaching face 51 of the wall body 50, and thereupon, the pair of left and right positioning protrusions 10 provided in a downwardly projected state are placed on the support plates 22 of the positioning support body 20 secured to the lower end portion of the attaching face 51. At this time, if the positioning protrusions 10 come to the positioning recesses 23 on the support plates 22 by one operation, then the positions of the supporting spheres 11 of the positioning protrusions 10 are aligned fully with the positions of the protrusion locking portion 23c, or if, after the supporting spheres 11 are brought into contact with the protrusion receiving portions 23a of the positioning recesses 23, the supporting spheres 11 roll and slide down along the inclined faces of the protrusion receiving portions 23a, until the supporting spheres 11 come to and are locked by the protrusion locking portions 23c. As a result, the positioning protrusions 10 are fitted into the positioning recesses 23. Since the position of the protrusion locking portion 23c is fixed in both of the vertical direction and the horizontal directions, when the positioning protrusions 10 are fitted in the positioning recesses 23, the positioning protrusions 10 are positioned at regular positions in regard to all of the vertical direction and the horizontal directions. On the other hand, when the load port apparatus L in the state wherein the interior side of the bogie truck body B is lifted is moved down on the support plates 22, if the positioning protrusions 10 are disposed in a little displaced state from the positioning recesses 23 as seen in FIG. 6, then if the load port apparatus L is moved a little, then the supporting spheres 11 roll and the positioning protrusions 10 come to the positioning recesses 23. Once the positioning protrusions 10 come to the positioning recesses 23, the supporting spheres 11 slide downwardly on the inclined faces of the protrusion receiving portions 23a immediately and are locked by the protrusion locking portions 23c and the positioning protrusions 10 are fitted into the positioning recesses 23. Accordingly, it is not necessary to take the utmost care spending time in order to adjust the positioning protrusions 10 precisely to the positioning recesses 23 at a point of time at which the interior side of the bogie truck body B of the load port apparatus L is lifted and placed on the support plates 22, and even if the positioning protrusions 10 should be displaced a little from the positioning recesses 23, if the load port apparatus L is moved by a small amount, then the supporting spheres 11 roll and the positioning protrusions 10 are guided to and positioned at the regular positions. Further, the pair of positioning protrusions 10 are fitted in the positioning recesses 23 to lock the supporting spheres 11 of the positioning protrusions 10 to the protrusion locking portions 23c and the overall load of the load port apparatus L is supported by the locking portions. As a result, the load port apparatus L is generally supported on the support plates 22. When the load port apparatus L supported on the support plates 22 is to be securely attached to the attaching face 51 by means of the screws 65 such as bolts, the number of screw-fastening places may be in the minimum. In the present embodiment, only by utilizing the threaded holes 37a formed at the upper end portions of the left and right side plate portions 37 of the load port apparatus L to fasten two left and right places of an upper end portion of the load port apparatus L by means of screws, the load port apparatus L is attached to the attaching face 51 with certainty and stably. Although the load port apparatus L usually has threaded holes formed also at a central portion of the left and right side plate portions 37 in the vertical direction, in the present embodiment, such threaded holes need not be used. Furthermore, also it can be carried out readily to remove the load port apparatus L from the attaching face 51. In particular, after the screws 65 are removed, the load port apparatus L is tilted forwardly in such a manner as to be pivoted around the fitting portions between the positioning protrusions 10 and the positioning recesses 23 until the casters 42 are brought into contact with the installation face G, or after the casters 42 are brought into contact with the installation face G, the interior side of the bogie truck body B of the load port apparatus L is lifted around the casters 42. Consequently, the tips of the protruding portions of the supporting spheres 11 are retracted from the openings 23b in which they have been fitted, and come out of the protrusion locking portions 23c simply to cancel the locking state. Consequently, the positioning protrusions 10 are removed from the positioning recesses 23 without suffering from interference.

Now, an attaching method of the load port apparatus L to the attaching face 51 is described with reference to FIGS. 7(A) to 7(D). First, the load port apparatus L is self-supported stably in a forwardly inclined posture to this side [FIG. 7(A)]. Then, the load port apparatus L would be carried by a worker (not shown) to a place in the proximity of the attaching face 51 of the wall body 50 of the manufacturing apparatus E. At this time, this carrying can be carried out sufficiently by a single worker, and the worker may stand on this side (on the right side in the figure) of the bogie truck body B of the load port apparatus L and carry the load port apparatus L in a state wherein the interior side (left side in the figure) of the bogie truck body B of the load port apparatus L is lifted around the contact point G1 between the casters 42 and the installation face G to such a degree that the support bolt 43 is spaced away from the installation face G. Where the worker lifts the load port apparatus L, since the load port apparatus L is in a forwardly inclined posture, the interior side of the bogie truck body B can be lifted readily around the contact point G1 and can be carried readily. As described above, the worker would lift the positioning protrusions 10 on the mounting board 31 side of the load port apparatus L around the contact point G1 and make use of the casters 42 to move the load port apparatus L in the lifted state so as to approach the attaching face 51. [FIG. 7(B)]. The interior side of the bogie truck body B of the load port apparatus L in the lifted state is lowered to the support plates 22 around the contact point G1 so that the pair of positioning protrusions 10 may individually be fitted into the positioning recesses 23 [FIG. 7(C)]. At this time, if the supporting spheres 11 of the positioning protrusions 10 do not come to the positioning recesses 23, then the interior side of the bogie truck body B is moved a little leftwardly or rightwardly or else forwardly or rearwardly so that the positioning protrusions 10 are fitted into the positioning recesses 23. If the positioning protrusions 10 are fitted into the positioning recesses 23 with the supporting spheres 11 locked by the protrusion locking portion 23c, then positioning of the load port apparatus L is completed automatically and the load port apparatus L is supported on the support plates 22 [FIG. 7(D)]. Finally, the worker would fasten two left and right locations of an upper end portion of the load port apparatus L by means of the screws 65 such as bolts through washers 66 to attach the load port apparatus L to the attaching face 51. Since the attaching apparatus A1 is configured from the positioning protrusions 10 and the positioning support body 20, when the positioning protrusions 10 are fitted into the positioning recesses 23, even where the positioning protrusions 10 cannot be observed readily due to the presence of the cover body 39 of the load port apparatus L, only if the positioning protrusions 10 are placed on the upper face of the support plates 22, then positioning is guided readily and completed automatically only by moving the load port apparatus L a little. Further, the number of fastening locations of the load port apparatus L to the attaching face can be minimized. Accordingly, the worker by himself can sufficiently carry out carrying, positioning and attachment of the load port apparatus L in a short period of time. It is to be noted that, as the timing at which the positioning support body 20 is attached to a lower end portion of the attaching face 51, the positioning support body 20 may be attached in advance before the load port apparatus L is carried to the attaching face 51 or the positioning support body 20 may be attached immediate prior to attachment of the load port apparatus L after the load port apparatus L is carried, and a convenient timing may be selected on demand. Further, as regards mounting and removal of the bogie truck body B, since the bogie truck body B is fastened to the load port apparatus L by means of screws through the side plate portions 37, it can be mounted and removed suitably as occasion demands. On the other hand, when the load port apparatus L attached to the attaching face 51 is to be removed, this can be implemented readily by the following procedure. First, the screws 65 at two locations are removed. Then, the load port apparatus L is forwardly inclined in a pivoting manner around the fitting portion between the positioning protrusions 10 and the positioning recesses 23 until the casters 42 are contacted with the installation face G. After the casters 42 are contacted with the installation face G, the interior side of the bogie truck body B of the load port apparatus L is lifted a little now around the casters 42, whereupon the supporting spheres 11 are removed simply from the protrusion locking portions 23c. Therefore, the positioning protrusions 10 are removed from the positioning recesses 23 without suffering from interference. Finally, while the interior side of the bogie truck body B is kept lifted, the load port apparatus L is moved from the attaching face 51 and the manufacturing apparatus E making use of the casters 42.

Figure 8:
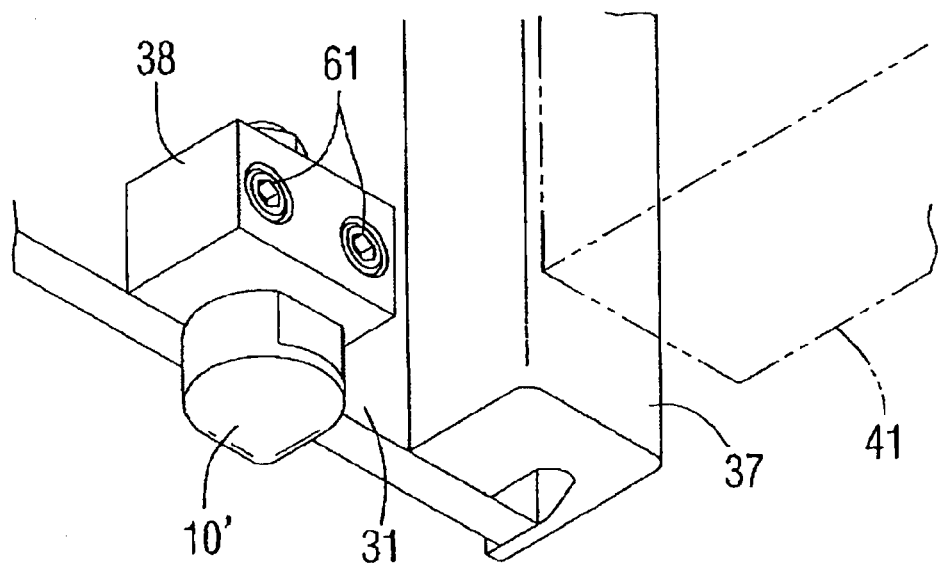
FIG. 8(A) is a perspective view of a positioning protrusion 10' in a state wherein it is attached to a lower end portion of a mounting board 31 in an attaching apparatus A2.
FIG. 8(B) is a vertical sectional view illustrating a state wherein a positioning protrusion 10' is fitted in a positioning recess 23 formed on a support plate 22 of a positioning support body 20.
Figure 8:
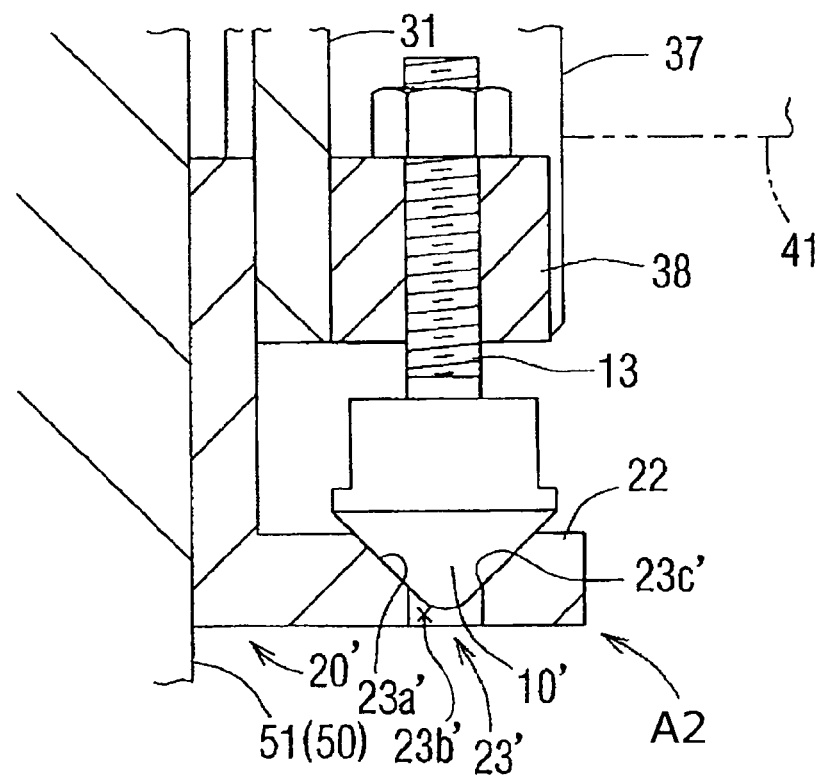

Now, an attaching apparatus A2 of another embodiment (second embodiment) is described with reference to FIGS. 8(A) and 8(B). FIG. 8(A) is a perspective view of a positioning protrusion 10' in a state wherein it is attached to a lower end portion of a mounting board 31 in an attaching apparatus A2. FIG. 8(B) is a vertical sectional view illustrating a state wherein the positioning protrusion 10' is fitted in a positioning recess 23' formed on a support plate 22 of a positioning support body 20'. It is to be noted that, in FIG. 8(B), screws for fastening are omitted. Also the attaching apparatus A2 having the following configuration is possible as the second embodiment. The configuration of the attaching apparatus A2 is different from the attaching apparatus A1 in the shape of positioning protrusions 10'. In particular, while the positioning protrusions 10 of the attaching apparatus A1 have a load supporting unit structure which includes the supporting spheres 11 which receive a load and roll, the positioning protrusions 10' of the attaching apparatus A2 are projecting members having a circular transverse sectional shape and having a conical end portion and correspond to a hollow circular truncated conical shape of the protrusion receiving portions 23a' of the positioning recesses 23'. The positioning protrusions 10' are attached to the left and the right of a lower end portion of the mounting board 31 similarly to the positioning protrusions 10. In the attaching method of the load port apparatus L where the attaching apparatus A2 is used, if a lower end portion of the interior side of the bogie truck body B of the load port apparatus L is lifted and then the positioning protrusions 10' are moved down on the support plates 22, then if the positions of the positioning protrusions 10' and the positioning recesses 23' coincide with each other, then they are fitted with each other as they are. Even if the positions of the positioning protrusions 10' and the positioning recesses 23' are displaced a little from each other, if the load port apparatus L is moved a little, then the positioning protrusions 10' drop into the positioning recesses 23' and they are fitted with each other. At this time, the positioning protrusions 10' are locked by the protrusion locking portions 23c' in a state wherein the ends of the positioning protrusion 10' having a conical shape are fitted a little in the openings 23b', and the overall load of the load port apparatus L is supported by the positioning recesses 23' through the positioning protrusions 10'. Since the entire side walls of the positioning protrusions 10' contact with the entire surfaces of the protrusion receiving portions 23a', in comparison with the case of the supporting spheres 11 of the positioning protrusions 10, the total area over which the overall load of the load port apparatus L is supported is greater. Therefore, the load port apparatus L is supported in a further stabilized state. As regards positioning of the load port apparatus L, it is similar to that of the attaching apparatus A1, and since the position of the positioning recesses 23' is determined, where the positioning protrusions 10' are fitted in the positioning recesses 23', they are positioned with regard to all directions of the vertical direction and the horizontal directions.

Figure 9:
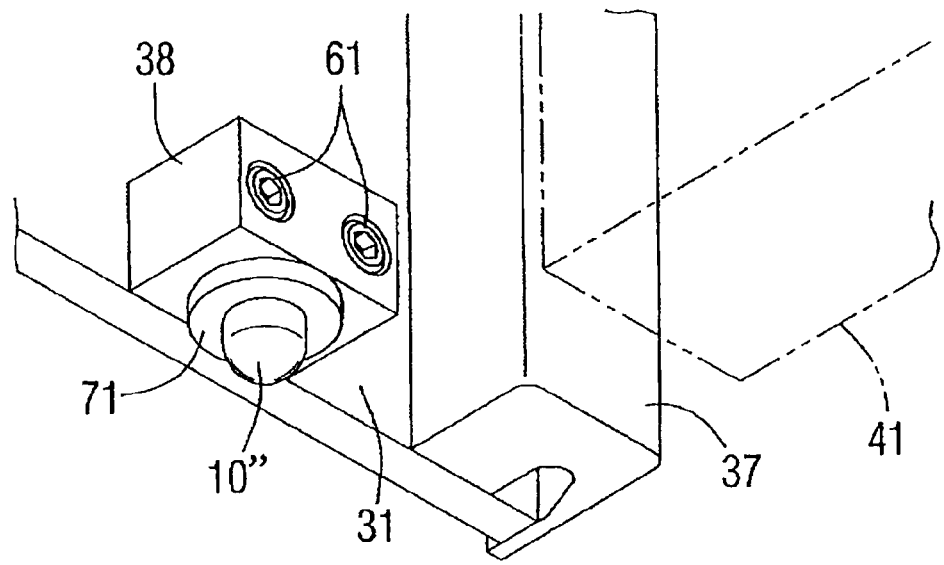
FIG. 9(A) is a perspective view of a positioning protrusion 10" in a state wherein it is attached to a lower end portion of a mounting board 31 in an attaching apparatus A3.
FIG. 9(B) is a vertical sectional view illustrating a state wherein the positioning protrusion 10" is fitted in a positioning recess 23 formed on a support plate 22 of a positioning support body 20.
Figure 9:
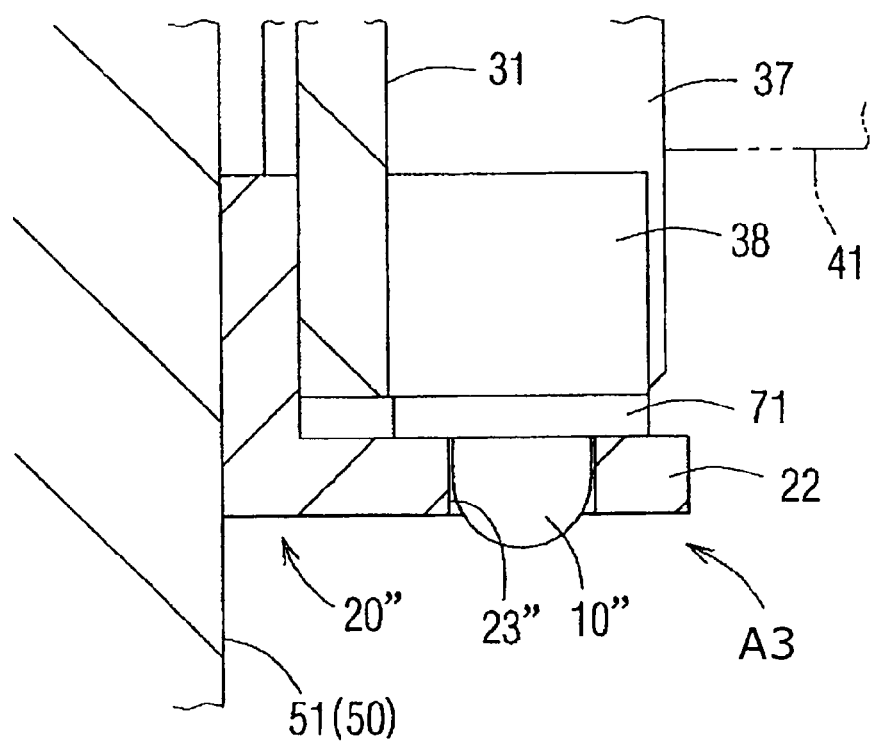
Figure 10:
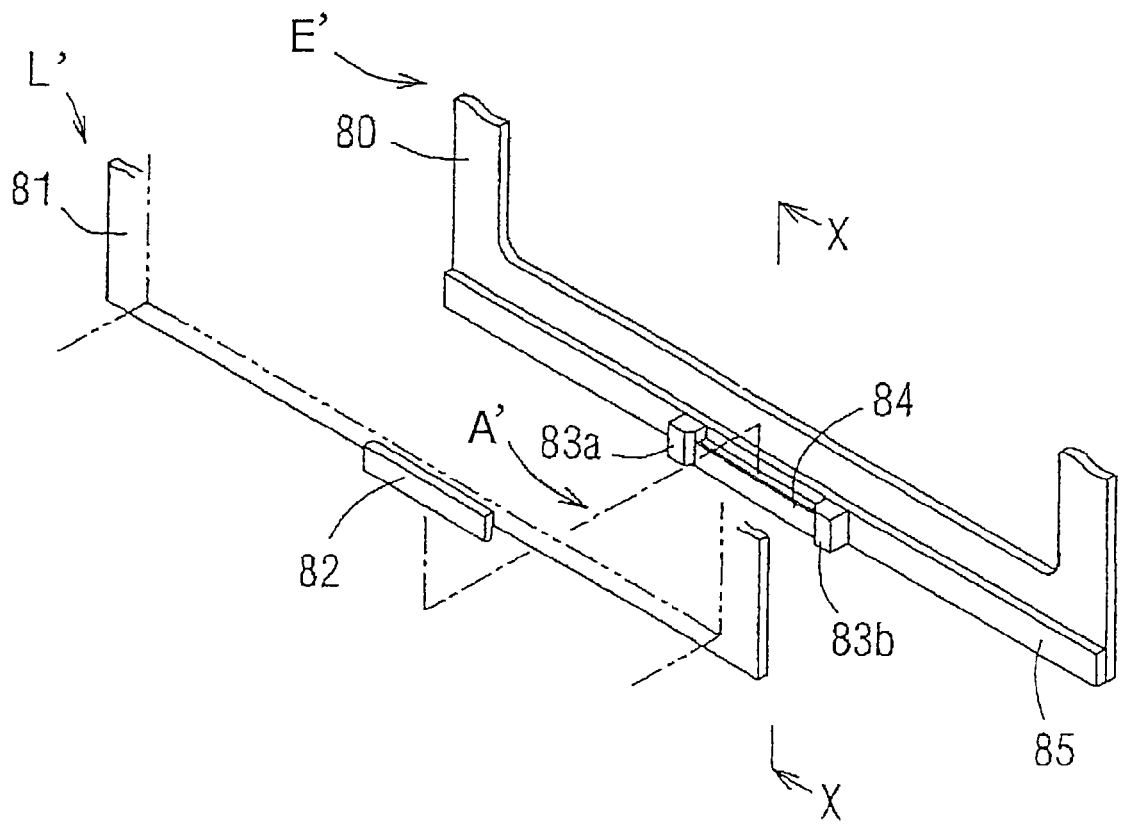
FIGS. 10(A) and 10(B) are respectively a perspective view and a sectional view of a conventional attaching apparatus A'.
Figure 10:
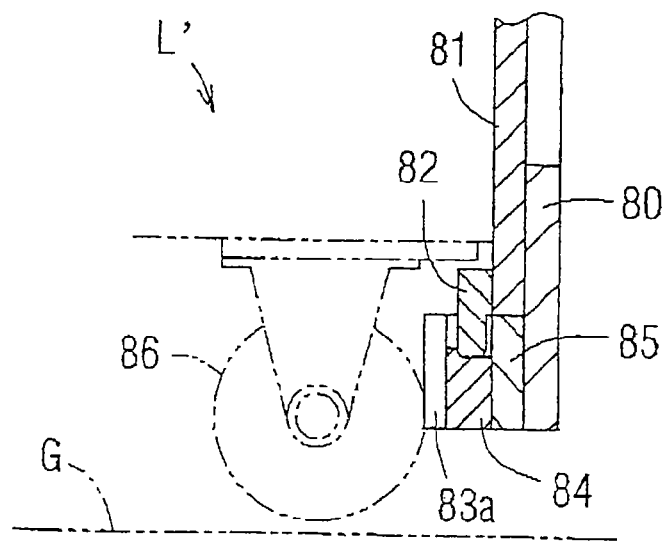

Now, an attaching apparatus A3 of a further embodiment (third embodiment) is described with reference to FIGS. 9(A) and 9(B). FIG. 9(A) is a perspective view of a positioning protrusion 10" in a state wherein it is attached to a lower end portion of a mounting board 31 in an attaching apparatus A3. FIG. 9(B) is a vertical sectional view illustrating a state wherein the positioning protrusion 10" is fitted in a positioning recess 23" formed on a support plate 22 of a positioning support body 20". It is to be noted that, in FIG. 9(B), screws for fastening are omitted. As the third embodiment, also an attaching apparatus A3 having such a configuration as described below is possible. The configuration of the attaching apparatus A3 is different from the attaching apparatus A1 in the positioning protrusions 10" and positioning recesses 23". In particular, although the positioning protrusions 10" of the attaching apparatus A3 have a circular transverse sectional shape, they are projecting members of such a shape that a hemisphere is joined to one end of a cylindrical body. Further, although the configuration of the support plates 22 of the positioning support body 20" is same as that of the attaching apparatus A1, the shape of the positioning recesses 23" formed on the support plates 22 is a hollow cylindrical shape corresponding to the diameter of the protrusions 10". The protrusions 10" are attached to the left and the right of a lower end portion of the mounting board 31 through a load receiving portion 71 in the form of a plate. The attaching method of the load port apparatus L wherein the attaching apparatus A3 is used is similar to that in the case of the attaching apparatus A1 or A2. Further, also as regards positioning of the load port apparatus L, the protrusions 10" are fitted in the positioning recesses 23" to position the load port apparatus L with regard to all directions of the vertical direction and the horizontal directions. In the case of the attaching apparatus A3, since the load of the load port apparatus L is received by the load receiving portions 71, the protrusions 10" are formed as projecting members only for positioning. Since the load port apparatus L is supported on the support plates 22 through the load receiving portion 71, attachment of the attaching face 51 of the load port apparatus L can be achieved with a minimum number of screws and only it is necessary to secure the upper end portion of the side plate portions 37 of the load port apparatus L by means of the screws 65. It is to be noted that, while, in the embodiments described above, the shape of the transverse section (as viewed in plan) of the positioning protrusions 10, 10' and 10" and the positioning recesses 23, 23', and 23" are a circular shape, the shape in the invention is not limited to the circular shape, but the shape does not matter if the two members can be complementarily fitted with each other.

The invention claimed is:

1. An attaching apparatus provided to a wafer carrier load port apparatus and a semiconductor manufacturing apparatus to attach said wafer carrier load port apparatus to an attaching face of said semiconductor manufacturing apparatus, comprising:
a bogie truck body attached to a lower end portion of said wafer carrier load port apparatus;
a plurality of positioning protrusions attached to a lower end portion of said wafer carrier load port apparatus such that said plurality of positioning protrusions protrude downwardly;
a support plate secured to a lower end portion of said attaching face such that said support plate projects outwardly from said attaching face; and
an upper face of said support plate including a plurality of positioning recesses that receive and fit each of said plurality of positioning protrusions, wherein
each of said plurality of positioning protrusions has a circular transverse sectional shape, and
each of said plurality of positioning recesses has a circular hollow shape, in a plan view, such that said plurality of positioning protrusions are individually fitted with said plurality of positioning recesses.

2. The attaching apparatus according to claim 1, wherein said support plate includes an integral fixing plate which is mounted to said attaching face via bolts secured to threaded holes disposed on said attaching face at a standard pitch.

3. The attaching apparatus according to claim 1, wherein said bogie truck body further comprises:
left and right casters attached to a bottom side of said bogie truck body on a side furthest from said wafer carrier load port apparatus, and
left and right supports which are adjustable in height and attached to a bottom side of said bogie truck body nearer to said wafer carrier load port apparatus than are said left and right casters.

4. The attaching apparatus according to claim 3, wherein said left and right supports are support bolts which are adjustable in height.

5. The attaching apparatus according to claim 1, wherein said bogie truck body is attached to a wafer carrier load port apparatus that can support itself.

6. The attaching apparatus according to claim 1, wherein said bogie truck body and said plurality of positioning protrusions are removably mounted on said wafer carrier load port apparatus, and
said support plate is removably mounted on said attaching face.

7. The attaching apparatus according to claim 1, wherein each of said plurality of positioning protrusions further comprises a conical end portion, and
each of said plurality of positioning recesses further comprises a truncated conical shape corresponding to said conical end portion of each of said plurality of positioning protrusions.

8. The attaching apparatus according to claim 1, wherein each of said plurality of positioning recesses includes a receiving portion located between an outer peripheral rim and an inner peripheral edge of each of said plurality of positioning recesses, said receiving portion being tapered to direct each of said plurality of positioning protrusions toward said inner peripheral edge portion of each of said plurality of positioning recesses.

9. The attaching apparatus according to claim 8, wherein the inner peripheral edge portion of each of said plurality of positioning recesses contacts each of said plurality of positioning protrusions along the entire peripheral edge portion so as to lock the said plurality of positioning protrusions in a fixed position and to bear an overall weight of said wafer carrier load port apparatus.

10. The attaching apparatus according to claim 1, wherein said support plate includes an integral fixing plate which is mounted to said attaching face via a plurality of fasteners.

11. The attaching apparatus according to claim 1, wherein said bogie truck is attached to a wafer carrier load port apparatus whose upper end portion includes two threaded holes and which is removably fastenable to said attaching face via fasteners secured through said threaded holes to corresponding threaded holes included in said attaching face.

12. An attaching apparatus provided to a wafer carrier load port apparatus and a semiconductor manufacturing apparatus to attach said wafer carrier load port apparatus to an attaching face of said semiconductor manufacturing apparatus, comprising:

a bogie truck body attached to a lower end portion of said wafer carrier load port apparatus;

a plurality of positioning protrusions attached to a lower end portion of said wafer carrier load port apparatus such that said plurality of positioning protrusions protrude downwardly;

a support plate secured to a lower end portion of said attaching face such that said support plate projects outwardly from said attaching face; and an upper face of said support plate including a plurality of positioning recesses that receive and fit each of said plurality of positioning protrusions, wherein each of said plurality of positioning protrusions includes a supporting body and a supporting sphere, said supporting sphere is supported by said supporting body such that said supporting sphere can rotate in all directions, and said supporting sphere protrudes from a bottom face of said supporting body.

\* \* \* \* \*